(12) United States Patent
Bolognia et al.

(10) Patent No.: US 9,254,995 B2
(45) Date of Patent: Feb. 9, 2016

(54) MULTI-PORT DEVICE PACKAGE

(71) Applicant: Analog Devices, Inc., Norwood, MA (US)

(72) Inventors: David Bolognia, North Andover, MA (US); Vikram Venkatadri, Lowell, MA (US)

(73) Assignee: Analog Devices, Inc., Norwood, MA (US)

( * ) Notice: Subject to any disclaimer, the term of this patent is extended or adjusted under 35 U.S.C. 154(b) by 198 days.

(21) Appl. No.: 14/028,856

(22) Filed: Sep. 17, 2013

(65) Prior Publication Data
US 2015/0076628 A1    Mar. 19, 2015

(51) Int. Cl.
| | |
|---|---|
| H04R 25/00 | (2006.01) |
| B81B 7/00 | (2006.01) |
| H04R 1/40 | (2006.01) |
| B81C 1/00 | (2006.01) |
| H04R 1/04 | (2006.01) |
| H04R 9/08 | (2006.01) |

(52) U.S. Cl.
CPC ............ B81B 7/0074 (2013.01); B81C 1/00309 (2013.01); H04R 1/04 (2013.01); H04R 1/406 (2013.01); H04R 25/405 (2013.01); *B81B 7/008* (2013.01); *B81B 7/0058* (2013.01); *B81B 2201/0257* (2013.01)

(58) Field of Classification Search
CPC ............ B81C 1/00134; B81C 1/00182; B81C 1/0023; H04R 1/04; H04R 1/08; H04R 1/083; H04R 1/086; H04R 1/406; H04R 1/1016; H04R 1/1041; H04R 5/033; H04R 5/04; H04R 19/04; H04R 19/016; H04R 27/00; H04R 27/04; H04R 2420/07

USPC ............................ 381/174, 175, 355, 356, 369
See application file for complete search history.

(56) References Cited

U.S. PATENT DOCUMENTS

| | | | |
|---|---|---|---|
| 6,061,245 A | 5/2000 | Ingraham et al. | |
| 6,324,907 B1 | 12/2001 | Halteren et al. | |
| 6,841,855 B2 | 1/2005 | Jaeck et al. | |
| 6,884,653 B2 | 4/2005 | Larson | |
| 7,291,907 B2 | 11/2007 | RaghuRam | |
| 8,170,244 B2 | 5/2012 | Ryan et al. | |
| 8,270,634 B2 | 9/2012 | Harney et al. | |
| 8,605,919 B2 | 12/2013 | Awamura et al. | |
| 8,861,764 B2 * | 10/2014 | Tanaka et al. | 381/355 |
| 2004/0238936 A1 | 12/2004 | Rumer et al. | |

(Continued)

OTHER PUBLICATIONS

European Extended Search Report mailed Jan. 19, 2015 issued in EP Application No. 14180571.3 filed Aug. 11, 2014, 7 pages.

(Continued)

*Primary Examiner* — Brian Ensey
(74) *Attorney, Agent, or Firm* — Knobbe, Martens, Olson, & Bear LLP

(57) ABSTRACT

An integrated device package includes a housing having a first opening and a second opening in fluid communication with an interior volume of the housing. A package substrate (s) has a first port and a second port. A first device die is mounted to the substrate(s) over the first port. A second device die is mounted to the substrate(s) over the second port. The substrate(s) is coupled to the housing to cover the first and second openings such that the first device die is disposed within the interior volume through the first opening and the second device die is disposed within the interior volume through the second opening.

20 Claims, 16 Drawing Sheets

(56) References Cited

U.S. PATENT DOCUMENTS

| | | |
|---|---|---|
| 2005/0012199 A1 | 1/2005 | Rosenau et al. |
| 2006/0033217 A1 | 2/2006 | Taggart et al. |
| 2006/0091508 A1 | 5/2006 | Taggart et al. |
| 2008/0212817 A1 | 9/2008 | Lommel et al. |
| 2012/0151758 A1 | 6/2012 | Primavera |
| 2012/0212925 A1 | 8/2012 | Zoellin et al. |
| 2012/0250925 A1* | 10/2012 | Lillelund .................. 381/355 |

OTHER PUBLICATIONS

U.S. Appl. No. 13/739,953, filed Jan. 11, 2013 in 48 pages.

* cited by examiner

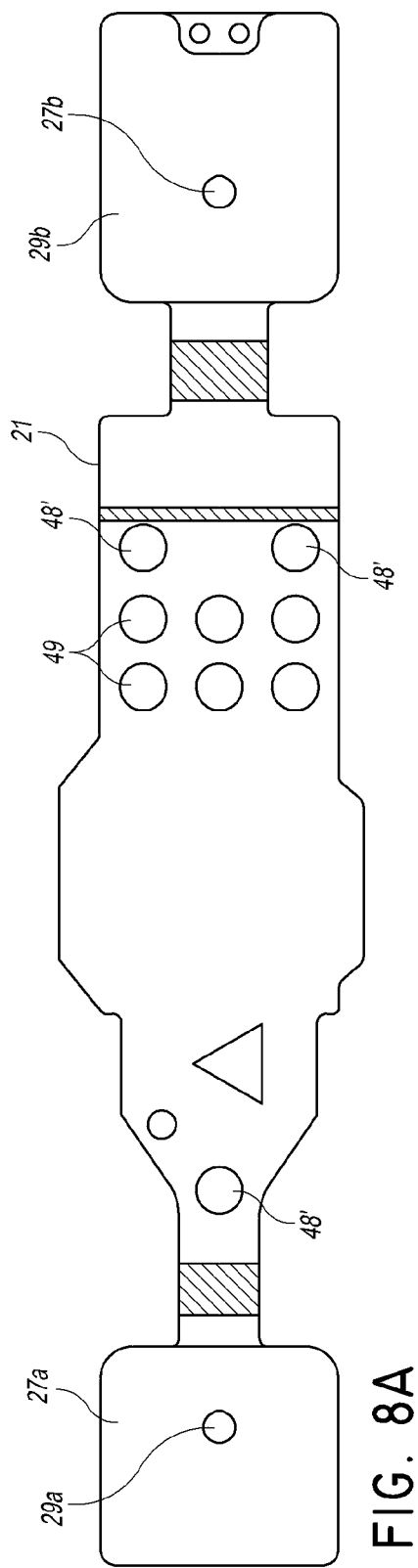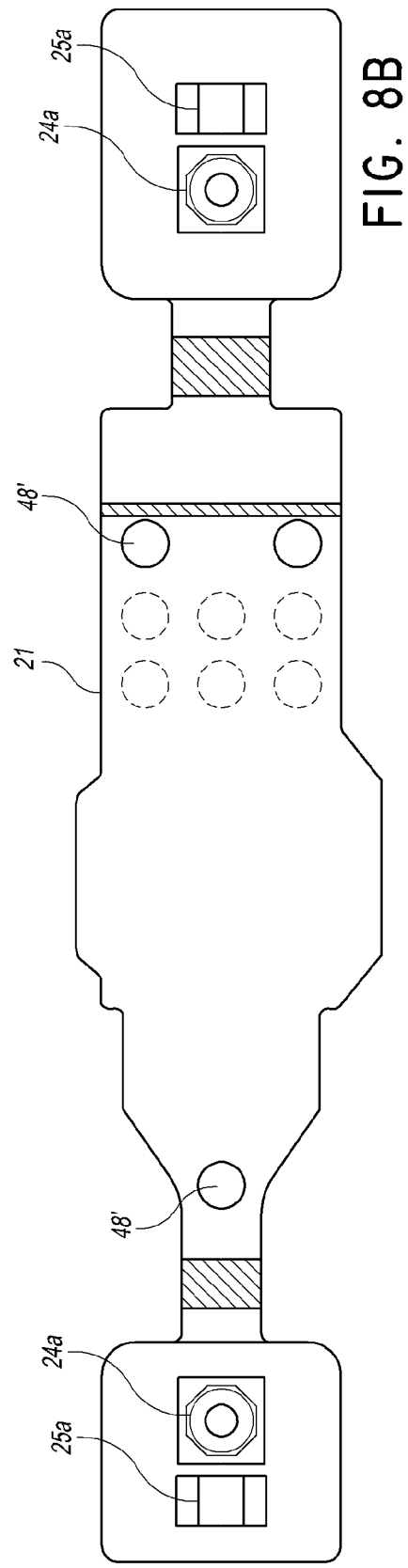

MULTI-PORT DEVICE PACKAGE

BACKGROUND OF THE INVENTION

1. Field of the Invention

The field relates generally to multi-port device packages, and, in particular, to microphone packages having multiple microphone device dies.

2. Description of the Related Art

Microphone packages are used in many types of electronic devices, such as mobile smartphones, tablet computing devices, medical devices (such as hearing aids), and various other applications. Various microphone device packages include a microphone device die coupled to a package substrate and enclosed within a package lid. The package typically includes a sound port configured to allow sound waves to pass from the outside environs to an interior of the package to interact with the microphone device die. A processor can also be mounted on the substrate to pre-process signals detected by the microphone device die. The lid and/or the substrate can enclose the microphone device die to protect the die from contamination and external forces, and can also act as a radio-frequency (RF) shield to prevent electromagnetic interference. Other types of packages can have similar ports for other types of communication, such as for pressure measurement or optical communication through the package housing.

Despite the widespread use of packages with ports for communication with housed device, there is a continuing effort to improve the functionality and manufacturability of such packages and assemblies.

SUMMARY

In one embodiment, an integrated device package is disclosed. The integrated device package can include a housing having a first opening and a second opening formed therein. The first and second openings can be in fluid communication with an interior volume of the housing. The integrated device package can also include one or more substrates including a first port and a second port. A first device die can be mounted to the substrate(s) over the first port. A second device die can be mounted to the substrate(s) over the second port. The substrate(s) can be coupled to the housing to cover the first and second openings such that the first device die is disposed within the interior volume through the first opening and the second device die is disposed within the interior volume through the second opening.

In another embodiment, a method of manufacturing an integrated device package is disclosed. The method can include providing a housing having a first opening and a second opening formed therein. The first and second openings can be in fluid communication with an interior volume of the housing. One or more substrate(s) having a first device die mounted to the substrate(s) over a first port formed in the substrate(s) and a second device die mounted to the substrate(s) over a second port formed in the substrate(s) can be provided. The method can also include positioning the first device die through the first opening and the second device die through the second opening. The substrate(s) can be coupled to the housing to cover the first and second openings.

In another embodiment, an integrated device package is disclosed. The integrated device package can include a housing having a first opening and a second opening formed therein. The first and second openings can be in fluid communication with an interior volume of the housing. A substrate can be folded about at least two sides of the housing to cover the first and second openings. A first device die can be mounted to the substrate and disposed through the first opening. A second device die can be mounted to the substrate and disposed through the second opening.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIG. 8A is a plan view of an exterior surface of a substrate used in the package of FIGS. 7A-7D.

FIG. 8B is a plan view of an interior surface of the substrate of FIG. 8A.

DETAILED DESCRIPTION

Figure 1:
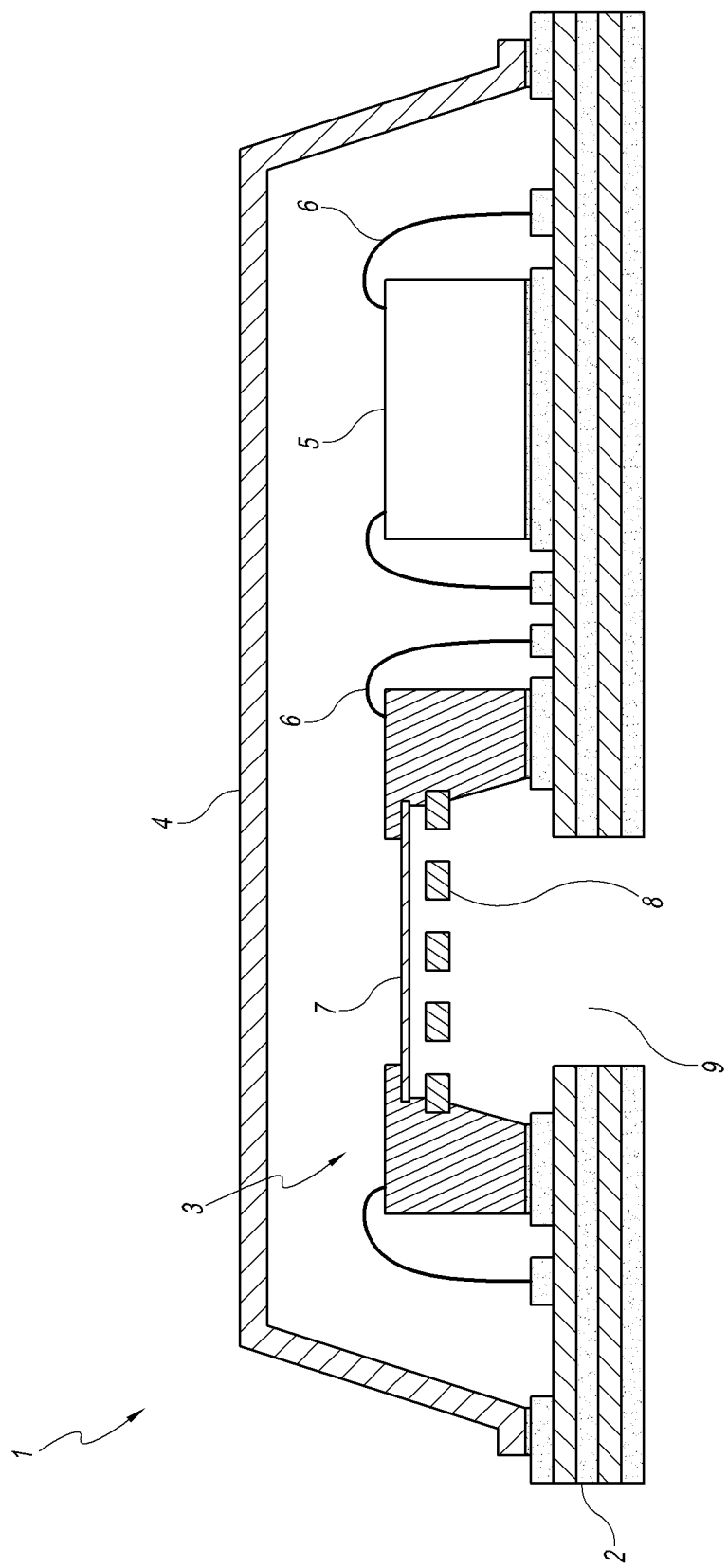
FIG. 1 is a schematic side cross-sectional view of a microphone device package formed by a package lid and substrate.

Various embodiments disclosed herein relate to a multi-port device package that includes a housing having multiple openings, each of which can be sized and shaped to receive one or more integrated device dies, such as a microphone device die and/or a processor in various illustrated embodiments. The device dies can be mounted to a substrate, which can include multiple ports formed through a thickness of the substrate. The device dies can be mounted over respective ports in the substrate.

The substrate can be coupled to the housing to dispose the device dies through the openings of the housing such that the device dies are positioned in the housing, e.g., within an interior volume of the housing. The substrate can cover the openings of the housing and, except for the ports, can substantially seal the openings and the device dies positioned within the interior volume of the housing from the outside environs. In various embodiments, the substrate can be flexible, such that the substrate can be folded or wrapped around multiple sides of the housing to position the device dies in the housing. The device dies can be disposed in the housing at various angles and positions. For example, in various embodiments, the housing and its openings may be shaped such that when the substrate and device dies are mounted to the housing, the device dies are angled relative to one another at desired angles and orientations, and/or separated from one another by a desired separation distance. In some embodiments, stiffeners and/or shields can also be coupled to the substrate and/or housing to provide structural support and/or shielding from radio-frequency (RF) interference. In some embodiments, a single common substrate can be used, but in other embodiments, multiple substrates can be employed in the disclosed packages.

The openings of the housing and the ports in the substrate can be configured to permit fluid communication between the outside environs and an interior volume of the housing. For example, in various embodiments, the openings of the housing and the ports in the substrate can be configured to allow air to communicate from the outside of the package through the ports in the substrate to interact with the device die. For example, in microphone packages, sound waves can pass from outside the package through the ports in the substrate, and microphone device dies can transduce the sound waves into electrical signals that can be processed by processor die(s) positioned inside or outside the housing. The interior volume of the housing can include one or more cavities that are sized and shaped to provide sufficient backvolume for a microphone device die. Advantageously, the housing can be shaped to create irregular three-dimensional volumes for the cavities to maximize the back volume and improve sound quality. For example, in some embodiments, each microphone device die can be disposed in the housing within or near a corresponding cavity such that the cavity provides adequate backvolume for operation of the microphone device die. In embodiments having multiple cavities, the cavities can be acoustically separated or sealed from one another such that each microphone device die has its own backvolume cavity. In other embodiments, multiple microphone device dies may share a common backvolume defined by multiple cavities that are in fluid communication with one another.

Furthermore, in the illustrated embodiments described herein, the package can include two cavities that have substantially the same volume, and each cavity can include a microphone device disposed therein. In such embodiments, matching the volume of the two cavities can enable system designers to match the performance of the two respective microphones, which can improve the overall performance of the microphone package. The substrate can be sealed to the housing over the openings to substantially acoustically seal the microphone device dies in the housing. The disclosed embodiments can accordingly improve microphone package performance by enabling the use of irregular or arbitrary, three-dimensionally shaped cavities that can be acoustically sealed by attaching and sealing the substrate over openings in the housing.

In some embodiments, the exterior of the package can include one or more interface features and/or conductive leads. For example, to couple to a larger system (e.g., a larger electronic device such as a hearing aid, mobile smartphone, tablet computing device, etc.), the package can be mounted to a system board, e.g., a printed circuit board (PCB). Conductive leads can be formed on an exterior surface of the package to enable the package to be mounted on the system board. In some embodiments, interface features, such as various sensors, can be disposed on an exterior surface of the substrate. For example, a capacitive touch sensor may be disposed on the exterior surface, and a user can interact with the touch sensor to control the larger system. Antennas, such as microstrip antennas, may also be formed on the exterior surface to provide wireless communication with other system components. Advantageously, the substrate can be shaped and folded about the housing such that the various interface features and/or leads can be disposed on any suitable exterior surface or side of the package that may be desired by the system manufacturer.

It should be appreciated that, although the packages illustrated herein are shown as incorporating microphone device dies, the packages can include any other suitable type of device die. For example, instead of, or in addition to, the illustrated microphone device dies, various processor device dies, sensor device dies (e.g., pressure sensors), optical device dies, inertial sensors (such as gyroscopes or accelerometers), and/or any suitable type of microelectromechanical systems (MEMS) device die may be used in conjunction with the disclosed packages. For example, in some embodiments, the package can include multiple cavities. One or more microphone device dies can be disposed in the cavities, and one or more accelerometer device dies can also be disposed in the cavities. For example, in one embodiment, the package can include two cavities sized and shaped to house a microphone device die and one cavity sized and shaped to house an accelerometer device die. In hearing aid applications, for example, the microphone device dies can be used to detect sound waves entering the housing. The accelerometer can detect the relative acceleration, velocity, and/or position of the package. In some embodiments, information provided by the accelerometer may be used to detect when a user is operating the hearing aid and/or when the user removes the hearing aid from the ear and sets it on a stationary object, such as a table. Furthermore, although two microphone device dies are illustrated herein, it should be appreciated that any suitable number of device dies can be used, such as one, three, four, five, six, seven, eight, etc.

The disclosed embodiments provide various advantages over other assemblies and packages. For example, the housing can be three-dimensionally formed to take any desirable shape for a particular application. In particular, the housing can be shaped to include multiple openings along multiple sides of the housing such that device dies can be positioned at desired angles, orientations, or positions relative to one another when the substrate is coupled to the housing. For example, in packages having multiple cavities where one of the cavities is employed for a reference microphone (e.g., for noise cancellation), the sizes of the cavities can be substantially matched to improve acoustic performance. In addition, the ability to orient device dies, such as microphone device dies, relative to one another at a particular angle and/or separation distance can advantageously enable the system designer to create sophisticated acoustic arrangements of the microphone dies. For example, by accurately angling the device dies relative to one another, system designers can create sophisticated directional microphone arrangements that can accurately account for stereo effects of receiving sound waves from multiple angles. Furthermore, multiple microphone device dies can be electrically coupled to one another (and/or to a processor(s) associated with a particular microphone device) such that processors can acoustically match the microphone dies and cancel any noise from the system and/or can account for any lead or lag between the microphone devices. Because the housing can be formed in any suitable three-dimensional shape, the housing can include multiple built-in cavities that, in some embodiments, are acoustically separated from one another to provide individual backvolume cavities for each microphone die. The housing can also advantageously be shaped to define spaces or volumes for mounting other types of electronic components or devices, such as accelerometers or other types of devices.

Accordingly, the three-dimensionally shaped housing can enable sophisticated acoustic applications by allowing the system designer to select relative orientations and positions of the device dies and to shape acoustic cavities within the housing interior as desired for a particular application. The use of a flexible substrate can enable the designer to fold or wrap the substrate about the housing to couple the device dies to the housing at the desired orientation while maintaining electrical communication between the device dies that are mounted to the substrate. The substrate can be sealed to the housing over the openings to provide a substantially acoustically sealed interface between the substrate and the housing. Further, providing leads and/or interface features (e.g., sensors) on exterior surfaces of the substrate can enable enhanced functionality between the package and the larger system and/or the user. All electrical connections and devices can be in or on the substrate, and the housing can be electrically dumb. Alternatively, the housing can support or house additional circuit elements and the substrate can be attached to the housing in such a way as to electrically communicate with the separately housed electrical element(s)

Furthermore, the disclosed assemblies and/or packages can be manufactured using simple and cost effective packaging techniques. For example, some microphone packages are designed such that a microphone device die is disposed within a cavity defined by a package lid and substrate. FIG. 1 is a schematic side cross-sectional view of a microphone device package 1 formed by a package lid 4 and a substrate 2. As shown in FIG. 1, a microphone device die 3 can be mounted to the substrate 2 over a sound port 9. Sound waves can enter the package 1 from the outside environs through the sound port 9. Sound waves can interact with the microphone device die 3 to deflect a movable membrane 7 relative to a backplate 8. A resulting change in capacitance induced between the movable membrane 7 and the backplate 8 can be processed by a processor die 5 programmed to pre-process the signals transduced by the microphone device die 3. Bonding wires 6 can electrically couple the microphone device die 3 and the processor die 5 to the substrate 2, and/or to each other. The acoustic features of the microphone package 1 can be designed by selecting the size and/or shape of the lid 4 and substrate 2, and/or the location and configuration of the sound port 9.

Thus, the microphone device package 1 of FIG. 1 is typically manufactured as a stand-alone package that can be incorporated into the larger system. In systems that utilize multiple microphones, the package assembler may combine multiple packages, each defining their own cavity, into the system, but the combination of multiple packages into the system involves additional manufacturing steps that can increase the cost and/or complexity of the system. For example, the package 1 is assembled in an initial packaging process that involves mounting and electrically coupling the dies 3, 5 to the substrate 2 and coupling the lid 4 to the substrate 2. To incorporate multiple microphones in an assembly or system, multiple packages like the package 1 would typically be separately mounted to a larger assembly or system in a subsequent system assembly step. Separate packaging and assembly steps can increase the costs and complexity of the system design by increasing the time, manpower, and/or material sets that are used to provide the functionality of multiple microphones. Furthermore, the package 1 of FIG. 1 may include a large number of components that can occupy a relatively large volume, which can be problematic for system designers desiring to reduce the size of the microphone package. For example, if multiple, separate packages 1 are used in a stand-alone manner, the overall device package might include multiple standard printed circuit board (PCB) substrates and multiple, separate lids to enclose the microphone device dies.

A further potential constraint on combining multiple packages into an assembly is that the system designer may not have adequate design freedom to achieve sophisticated acoustic performance that fully utilizes the advantages of having multiple microphones in an assembly. For example, the acoustic performance of the package 1 may be set at least in part by the size, shape, and relative orientation of the lid 4 and the substrate 2, and/or on the location and configuration of the sound port 9. However, it may be advantageous to provide different acoustic performance for different microphones, and/or to accurately orient or angle the microphones relative to one another. Combining multiple packages 1 into a system to achieve such sophisticated performance may be challenging based on the particular geometry of the package 1 or system. Moreover, as explained above, it can be advantageous to provide electrical communication between the multiple microphones to reduce noise and/or to match the microphones. Providing communication among multiple packages in a system may entail additional interconnections among separate packages, which can further increase the complexity and cost of the system. Accordingly, it can be advantageous to provide improved packaging and assembly arrangements for packages having multiple device dies and/or ports, and in particular, for microphone packages having multiple microphone device dies.

Figure 2:
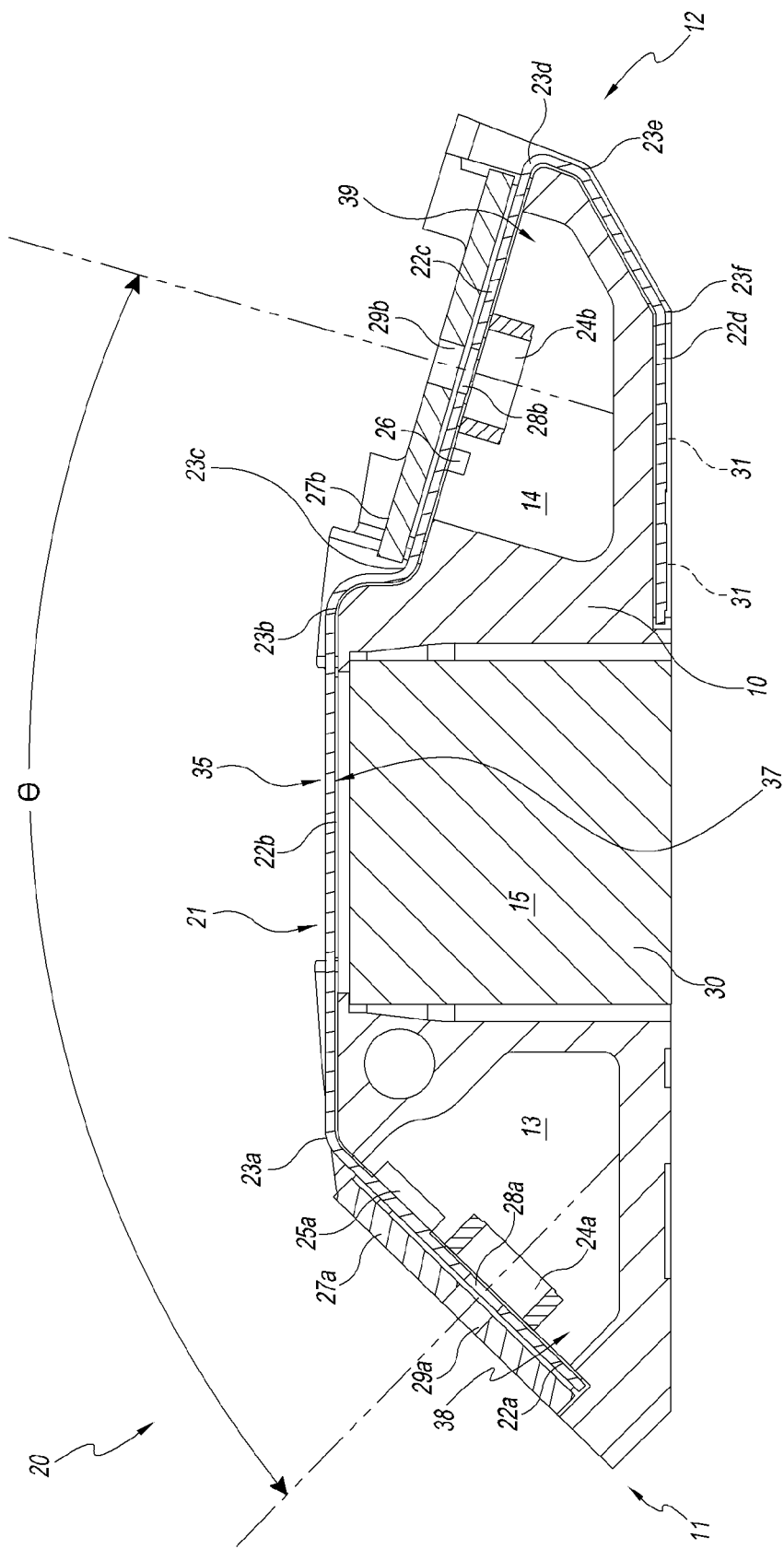
FIG. 2 is a schematic left side cross-sectional view of an assembled multi-port device package, according to one embodiment.
Figure 3A:
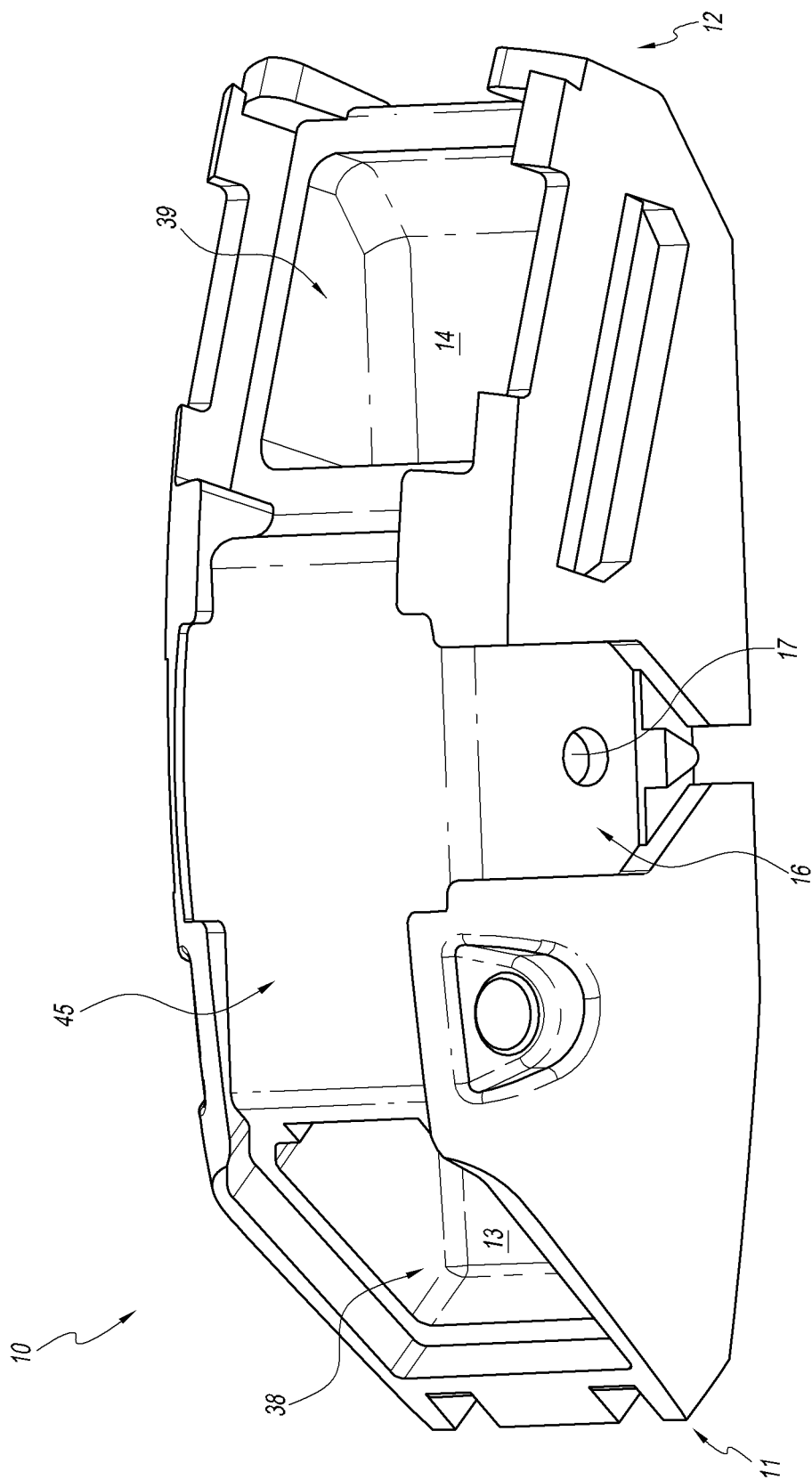
FIG. 3A is a three-dimensional, top, left side perspective view of a housing used in the multi-port device package of FIG. 2.
Figure 3B:
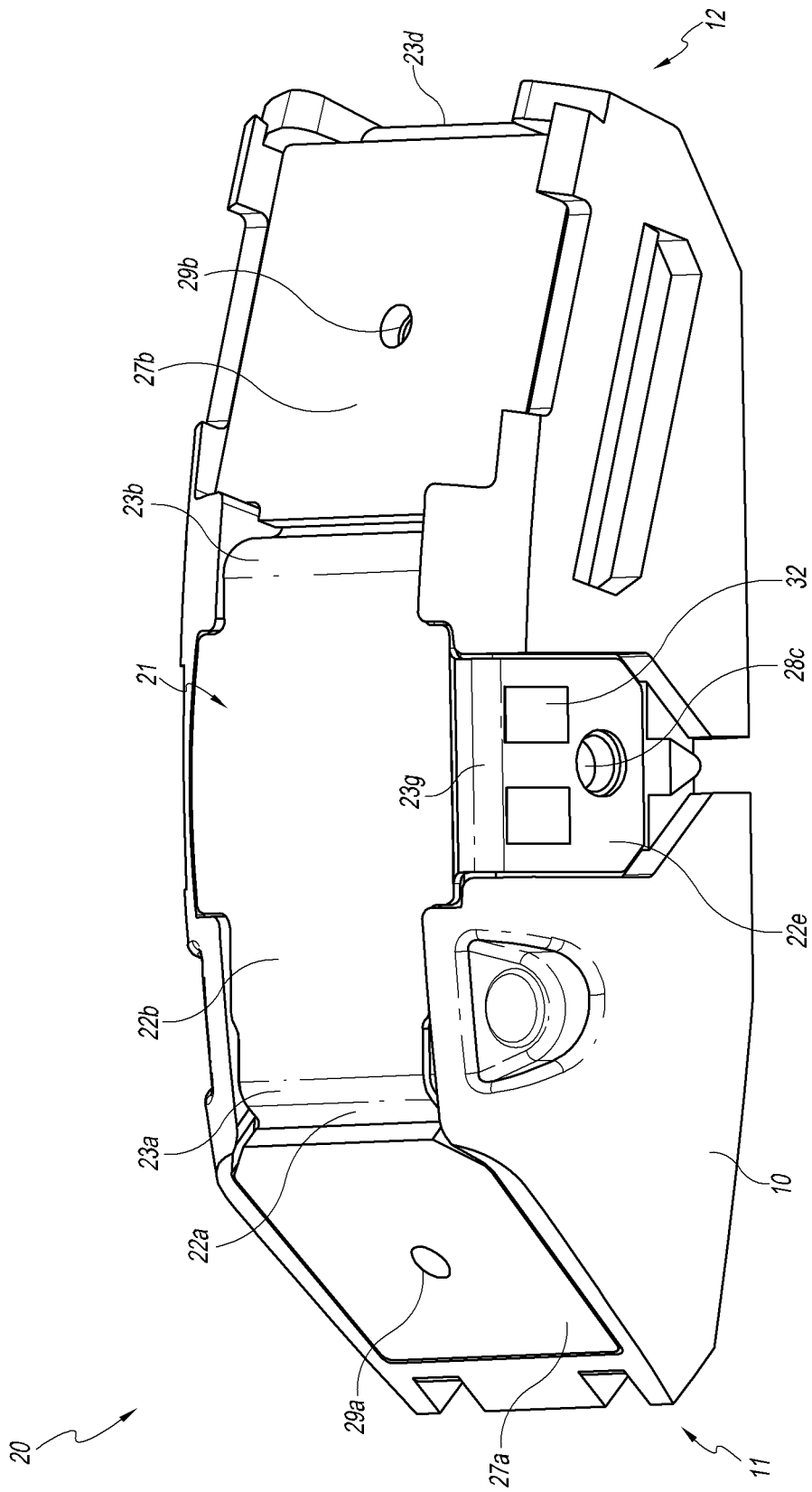
FIG. 3B is a three-dimensional, top, left side perspective view of the multi-port device package of FIG. 2.

FIG. 2 is a schematic left side cross-sectional view of a multi-port device package 20 having a housing 10, according to one embodiment. FIG. 3A is a three-dimensional, top, left side perspective view of the housing 10 used in the package 20 of FIG. 2. FIG. 3B provides the same view as FIG. 3A, but with a package substrate 21 added to complete the package 20. The housing 10 can have a top side 45 (see FIG. 3A) and a bottom side 47 (see FIG. 4A below). The package 20 can have a front end 12 and a rear end 11. The package 20 can include the housing 20 having a first opening 38 and a second opening 39 (see FIGS. 2 and 3A), a substrate 21, a first device die 24a mounted to the substrate 21, and a second device die 24b mounted to the substrate 21. In the embodiment of FIGS. 2-3B, the first and second device dies 24a, 24b are microphone device dies (which can be similar to the microphone device die 3 of FIG. 1 in some arrangements). In other embodiments, however, the device dies 24a, 24b can be any other suitable type of device dies, such as processor device dies, sensor device dies (e.g., pressure sensors), optical device dies, inertial sensors (such as gyroscopes or accelerometers) and/or any suitable type of MEMS device die, etc.

The housing 10 can be shaped to form any suitable three-dimensional profile, and can include an interior volume, e.g., an open volume in the housing 10. For example, the housing 10 can include a first cavity 13 near the rear end 11 in fluid communication with the first opening 38 and a second cavity 14 near the front end 12 in fluid communication with the second opening 39 (see also FIG. 3A). The first cavity 13 and the second cavity 14 can be separated by various walls of the housing 10 such that the first cavity 13 is acoustically isolated or separated from the second cavity 14. In other embodiments, however, the first and second cavities 13, 14 may be in fluid communication with one another, or the interior of the housing 10 may only include a single, continuous cavity.

The housing 10 can be made of any suitable material. In some embodiments, the housing 10 can comprise any suitable plastic or polymer, such as, e.g., liquid crystal polymer (LCP) or acrylonitrile butadiene styrene (ABS). The housing can be made of a material that is compatible with high temperatures in some embodiments (e.g., LCP), which can allow for the use of solder reflow at the system level. In other embodiments, the housing 10 can comprise a metal, such as zinc. In various embodiments, the housing 10 can be formed by molding, three-dimensional printing, casting, etc. The housing 10 can be three-dimensionally shaped to form complex geometries, including cavities having arbitrary shapes and features disposed at precise orientations and positions. For example, the housing 10 can be designed such that the first and second cavities 13, 14 are shaped to provide suitable backvolume for the device dies 24a and 24b, respectfully. The designer of the housing 10 can thus controllably adjust the shape of the cavities 13, 14 to achieve a desired backvolume and, hence, a desired acoustic performance. As explained above, for example, the cavities 13 and 14 can be accurately dimensioned to have substantially the same volume, which can match acoustic performance between the two cavities 13 and 14. The housing 10 can be designed to dispose the openings 38, 39 at any suitable orientation on the housing 10 so that the device dies 24a, 24b may also be disposed at any suitable orientation relative to one another.

Moreover, in various embodiments, the housing 10 can include a central cavity 15 separating the first and second cavities 13, 14. The central cavity 15 can be sized and shaped to receive additional circuit elements, such as the illustrated electronic component 30. The electronic component 30 can be any suitable component that the system designer would like to include in the package 20. For example, in some embodiments, the electronic component 30 in the central cavity 15 can be an Application-Specific Integrated Circuit (ASIC), a sensor (such as an accelerometer, gyroscope, etc.), wireless components, etc. In the illustrated embodiment, the electronic component 30 is a telecoil assembly that can be used to receive magnetic signals, which can be converted to sound and used in various devices, such as hearing aids, to process magnetic signals transmitted by other electronic devices (such as televisions, etc.).

In various embodiments, the substrate 21 can be a flexible substrate having integrated bond pads, leads and traces. Flexible substrates can be useful in arrangements where it is desirable for the substrate to conform to a particular geometry employed within a system, such as the three-dimensionally shaped housing 10. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry. The traces and leads can be patterned on the flexible substrate in very small dimensions. Accordingly, even though the device dies 24a, 24b may be mounted on separate segments of the substrate 21 and may be angled relative to one another on different sides of the housing 10, the internal traces of the substrate 21 can provide electrical communication between the device dies 24a, 24b (and/or among the dies and processors associated with the device dies 24a, 24b).

The substrate 21 can include an interior surface 37 adapted to face the interior of the housing 10, and an exterior surface 35 opposite the interior surface 37 and adapted to face away from the housing 10 (see FIG. 2). The first and second device dies 24a, 24b can be mounted to the interior surface 37 of the substrate 21. In addition, a first processor device die 25a can be mounted to the interior surface 37 of the substrate 21 adjacent to and in electrical communication with the first device die 24a, and a second processor device die 25b (see FIG. 6B below) can be mounted to the interior surface 37 adjacent to and in electrical communication with the second device die 24b. The processor dies 25a, 25b can process electrical signals transduced by the respective device dies 24a, 24b. Further, one or more passive components 26 may be mounted to the interior surface 37 of the substrate 21. The passive components 26 may include resistors, capacitors, etc. that can be used to smooth or otherwise pre-condition signals transduced by the device dies 24a, 24b. For example, in the illustrated embodiment, the passive components 26 can be used for filtering radio frequency (RF) signals.

The device dies 24a, 24b and/or the processor dies 25a, 25b can be electrically and physically coupled to the substrate 21 by any suitable electrical connection. For example, in some embodiments, the device dies 24a, 24b and/or processor dies 25a, 25b can be wire bonded to the substrate 21. In other embodiments, the device dies 24a, 24b and/or processor dies 25a, 25b can be coupled to the substrate 21 in a flip-chip configuration using anisotropic conductive film (ACF) or non-conductive paste (NCP) technologies. The device dies 24a, 24b and processor dies 25a, 25b can communicate with one another by direct connections or through traces in the substrate 21. In some embodiments, dies can be stacked on one another and either directly connected to one another, and one connected to the substrate 21, or stacked dies can be separately connected to the substrate 21. In one example, an additional die (not shown) is flipchip mounted face-to-face on each of the processor dies 25a, 25b. The additional die includes a capacitor array for the purpose of trimming and matching performance. In some embodiments, the processor dies 25a, 25b can include or can be coupled to an integrated passives device (IPD) that controls and/or manages the operation of passive devices, such as capacitors, resistors, etc.

The substrate 21 can be coupled to the housing 10 to cover the first and second openings 38, 39 of the housing 10 such that the first device die 24a is disposed in the first cavity 13 and the second device die 24b is disposed in the second cavity 14. The substrate 21 can be wrapped or folded around the housing 10 to cover both the first opening 38 and the second opening 39. As shown in FIGS. 3A-3B, the substrate 21 can be wrapped around the top side 45 of the housing 10. For example, a first segment 22a of the substrate 21 can be coupled to the housing 10 over the first opening 38. The first device die 24a and the first processor die 25a can be physically and electrically coupled to the first segment 22a such that both the first device die 24a and the first processor die 25a are disposed through the first opening 38 and at least partially in the first cavity 13. The first segment 22a of the substrate 21 can include a first port 28a formed therethrough to provide communication between the outside environs and the first cavity 13. The first device die 24a can be disposed over the first port 28a such that sound waves can pass through the first port 28a and can interact with the first device die 24a. For example, the sound waves can cause a movable membrane to vibrate relative to a backplate in some embodiments, as described with respect to the die 3 shown in FIG. 1.

Furthermore, a first stiffener 27a (see FIGS. 2 and 3B) can be coupled to the exterior surface 35 of the substrate 21 on a side of the first segment 22a opposite the device die 24a. The first stiffener 27a can have a first port hole 29a that can at least partially overlap or overlie the first port 28a of the substrate 21. The first stiffener 27a can be formed of any suitable material, such as a metal or plastic (e.g., polyimide), and can provide support to the substrate 21 and the first device die 24a when the substrate 21 is coupled to the housing 10. For example, the stiffener 27a can bear directly or indirectly against the walls of the housing 10 to prevent the substrate 21 from deforming over the first opening 38 and moving the first device die 24a back and forth within the first cavity 13. Further, the stiffener 27a may also act as a shield in some embodiments to prevent radio frequency (RF) interference. In other embodiments, metallic traces within the substrate 21 may be grounded to act as a RF shield.

The first segment 22a of the substrate 21 can be adhered or bonded to the housing 10 to acoustically seal the edges of the substrate 21. For example, in some embodiments, an adhesive can be applied on the substrate 21 or on the housing 10 surrounding the first opening 38 and can act to seal the substrate 21 to the housing 10. Thus, the substrate 21 can substantially acoustically seal the first cavity 13 such that sound waves can pass from the outside environs through the first port hole 29a of the first stiffener 27a and the first port 28a of the substrate 21. The sound waves can be detected by the first device die 24a, for example, by changing pressure that causes a movable membrane to vibrate relative to a backplate. The backvolume provided by the first cavity 13 can act as a reference pressure for the microphone and can be designed to have a shape suitable for the desired acoustic performance of the microphone. Accordingly, the substrate 21 can be used to position the first device die 24a through the opening 38 into the first cavity 13, and the substrate 21 can acoustically seal the die 24a in the cavity 13 such that sound funnels into the cavity 13 only through the first port 28a.

The substrate 21 can be bent or folded at a first bend 23a, and a second segment 22b can be coupled to the housing 10 over the central cavity 15, within which the electronic component 30 is housed. In some implementations, it can be desirable to bend the substrate 21 loosely such that there is extra substrate material at or near the bends or folds. For example, providing extra material at or near the bends can enhance manufacturability by making it easier for the assembler to wrap the substrate 21 about the housing 10. Furthermore, loose wrapping of the substrate 21 can also reduce tensile stresses in the substrate 21 that might otherwise damage seals and/or traces in the package. As with the first segment 22a, the second segment 22b can be adhered or otherwise bonded to the housing 10. The substrate 21 can be further bent at a second bend 23b and a third bend 23c to conform to the walls of the housing 10 and wrap around the housing 10.

A third segment 22c can be coupled to the housing 10 over the second opening 39. As above, the third segment 22c can be adhered or bonded to the housing 10 to substantially acoustically seal the second cavity 14. As with the first segment 22a, the second device die 24b, the second processor die 25b (see FIG. 6B), and the passive components 26 can be physically and electrically coupled to the interior surface 37 of the third segment 22c and can be disposed at least partly within the second cavity 14. As with the first device die 24a, the second device die 24b can be mounted over a second port 28b formed through the third segment 22c of the substrate 21. Further, a second stiffener 27b can be coupled to the exterior surface 35 of the third segment 22c and can have a second port hole 29b that at least partially aligns or overlaps the second port 28b of the substrate 21. As with the first device die 24a, sound waves can pass through the second port hole 29b of the stiffener 27b and the second port 28b of the substrate 21 and can interact with the second device die 24b. The second cavity 14 can be sized and shaped to provide adequate backvolume to achieve the desired acoustic performance of the second device die 24b.

As shown in FIG. 2, the openings 38 and 39 (and as further illustrated in FIG. 3A) can be angled relative to one another. Because the device dies 24a, 24b are positioned through the openings 38, 39, the device dies 24a, 24b may also be angled relative to one another. System assemblers can orient the device dies 24a, 24b at precise angles relative to one another to improve acoustic performance, such as the realization of stereo effects. By selecting the relative orientation and position of the first opening 38 and the second opening 39 of the housing 10, the system designer can accurately and precisely control the relative orientation of the device dies 24a, 24b. For example, as shown in FIG. 2, the first device die 24a can be mounted relative to the second device die 24b by an angle θ. The angle θ can be any suitable angle; for example, in some embodiments, θ can be in a range of about 0 degrees to about 90 degrees.

Furthermore, since the device dies 24a, 24b are mounted to the same substrate 21, the device dies 24a, 24b can electrically communicate with one another (and/or the associated processor dies 25a, 25b can communicate with one another or with a common central controller), even when the substrate 21 is bent or folded one or more times and when the device dies 24a, 24b are mounted on different sides of the housing 10. Advantageously, electrical communication directly or indirectly between the two dies 24a, 24b or between their processors across the housing 10 can enable processors to reduce noise and/or to compensate for lead/lag effects between the two device dies 24a, 24b. In other embodiments, however, multiple substrates may be coupled to the housing. For example, in some aspects, each substrate can include a port and a device die (such as a microphone die) coupled to each substrate over the port.

As shown in FIGS. 2 and 3B, the substrate 21 can further wrap or fold about the housing 10. For example, the substrate can fold around to a bottom side of the housing 10 by way of a fourth bend 23d, a fifth bend 23e, and a sixth bend 23f (see also FIGS. 4B and 5B, discussed below). A fourth segment 22d of the substrate 21 can couple to the bottom side of the housing 10.

With reference to FIG. 3A, the housing 10 can further include a side recess 16 formed in the left side of the housing 10. A side hole 17 can be provided through the left side of the housing 10. As shown in FIG. 3B, a fifth segment 22e of the substrate 21 can be folded relative to the second segment 22b at a seventh bend 23g. The fifth segment 22e can be bent along the side of the housing 10 and can be disposed in the side recess 16. The fifth segment 22e can have a third port 28c formed therethrough that can at least partially align with the side hole 17 of the housing 10. The side hole 17 in the housing 10 and the third port 28c of the substrate 21 can provide communication between the optional electronic component 30 within the central cavity 15 and the outside environs.

Furthermore, an interface feature 32 can be provided on the exterior surface 35 of the fifth segment 22e. As explained above, the interface feature 32 can include any suitable sensor on the exterior surface 35, such as a capacitive touch sensor. For example, in embodiments in which the interface feature 32 includes a touch sensor, the user can power on or off, control the volume, or otherwise operate the electronic component 30 (which is a telecoil assembly in the illustrated embodiment) to convert incoming magnetic signals into sound waves understandable by the listener (e.g., a user of a hearing aid). In other embodiments, however, conductive leads may be formed on the exterior surface 35 of the fifth segment 22e, for example, to provide electrical communication between the electronic component 30 in the central cavity 15 and the system board of the larger electronic system.

Figure 4A:
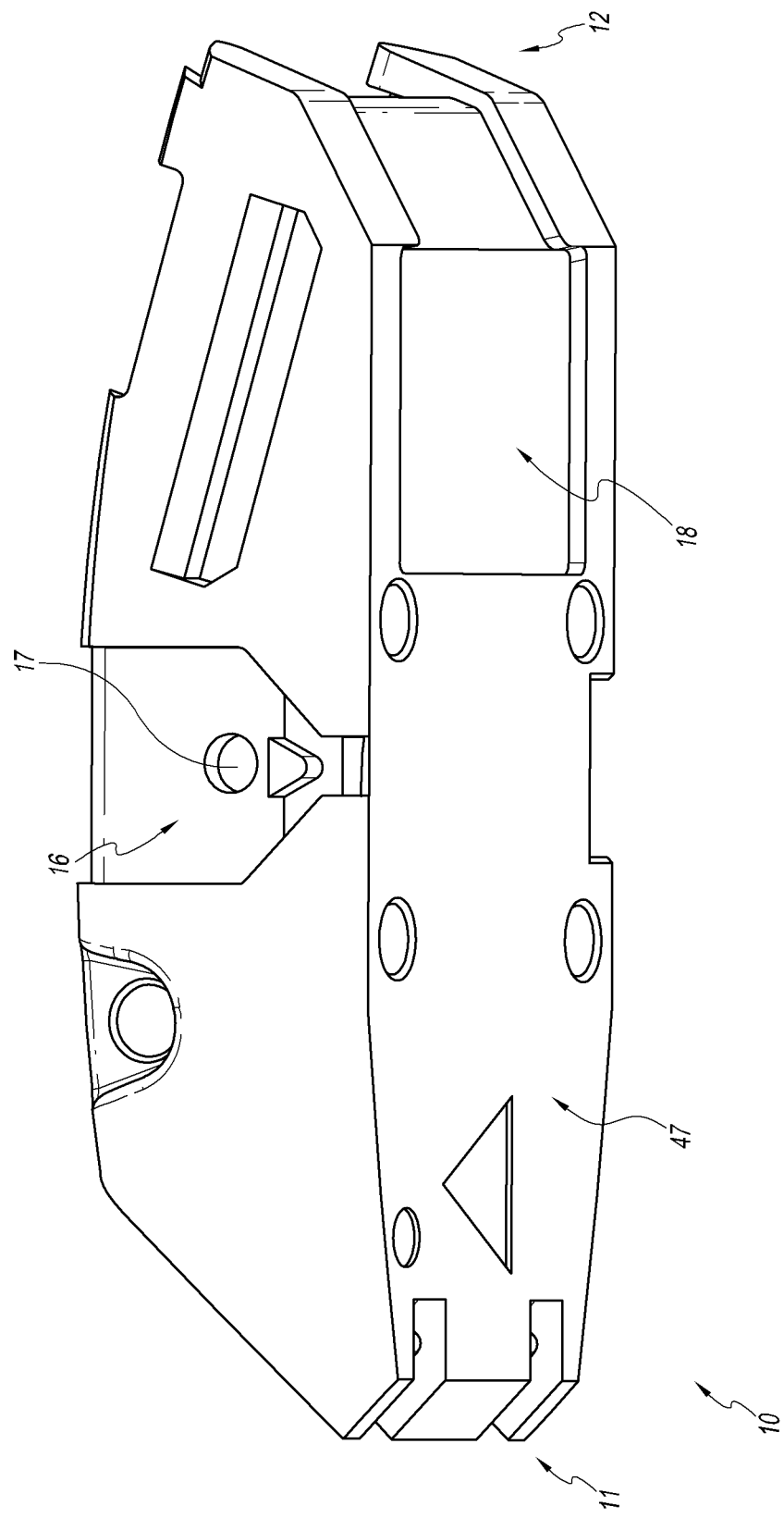
FIG. 4A is a three-dimensional, bottom, left side perspective view of the housing of FIG. 3A.
Figure 4B:
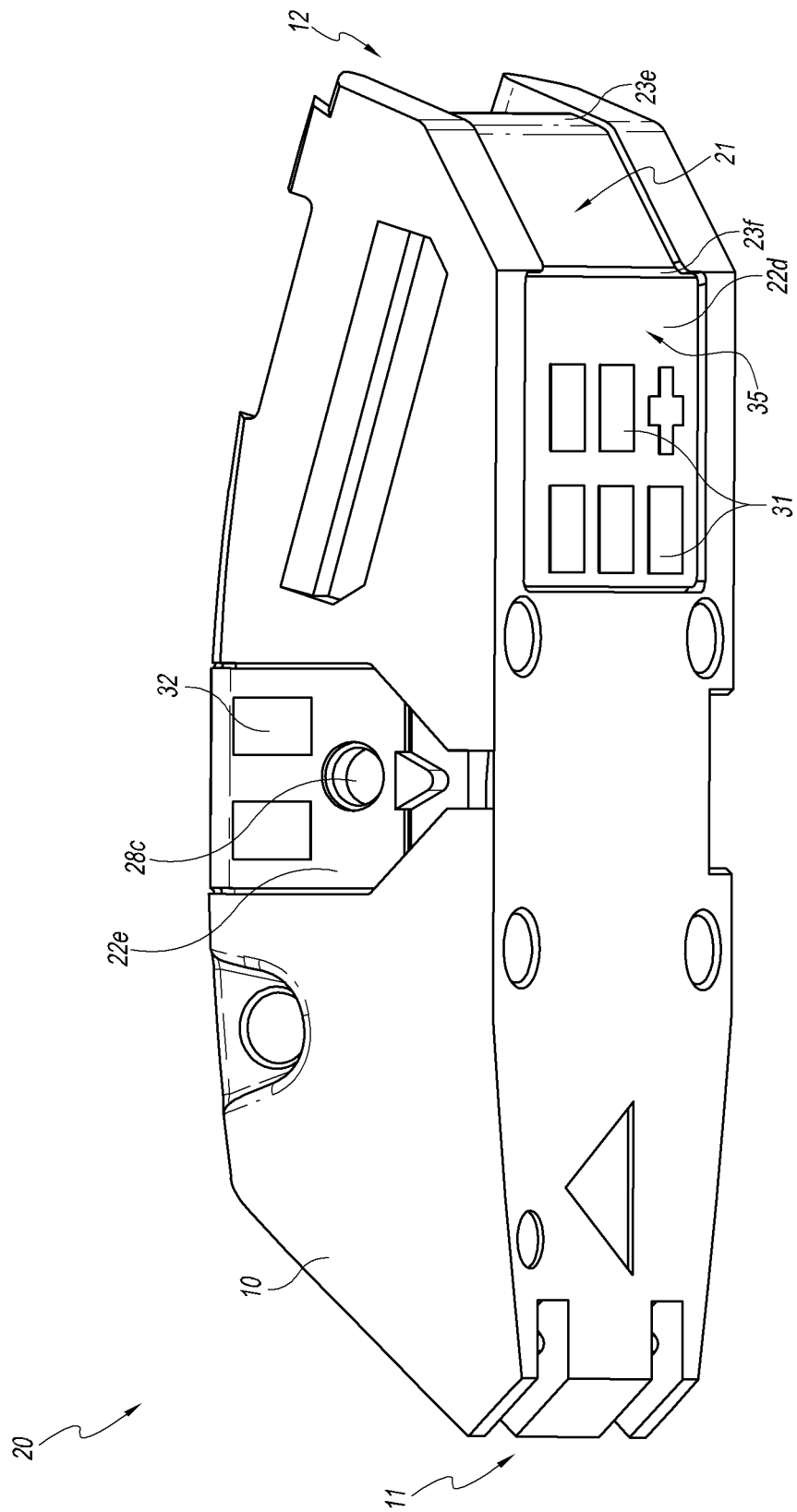
FIG. 4B is a three-dimensional, bottom, left side perspective view of the multi-port device package of FIG. 2.

FIG. 4A is a three-dimensional, bottom, left side perspective view of the housing 10 of FIG. 3A. As shown in FIG. 4A, the housing 10 can further include a bottom recess 18 formed in the bottom side of the housing 10 near the front end 12 of the housing 10. FIG. 4B is a view of the package 20 of FIG. 2 from the same perspective as FIG. 4A. As shown in FIG. 4B, the fourth segment 22d (see also FIG. 2) can be disposed in the bottom recess 18 and can be adhered or bonded to the housing 10. One or more conductive leads 31 (see also FIG. 2) can be formed in the exterior surface 35 of the fourth segment 22d. The leads 31 can provide electrical communication between the package 20 and a system board (such as a conventional PCB) of the larger electronic system. Thus, electrical signals can pass from the device dies 24a, 24b and/or processor dies 25a, 25b to the system board by way of the leads 31 and internal traces (not shown) that connect the leads 31 to the dies, and vice versa. In some embodiments, interface features, such as sensors, antennas, etc., may also be provided on the exterior surface 35 of the fourth segment 22d, or on any of the other segments (such as segment 22b or 22e, for example) the define the exterior surface of the package 20. For example, a touch sensor can be provided on one of the segments to act as an interface between a user and the package 20. The user may power on and off, and may operate the device, by way of the touch sensor. In addition, antennas may be provided on the exterior surface of one of the segments to provide wireless communication between the package 20 and other devices.

Figure 5A:
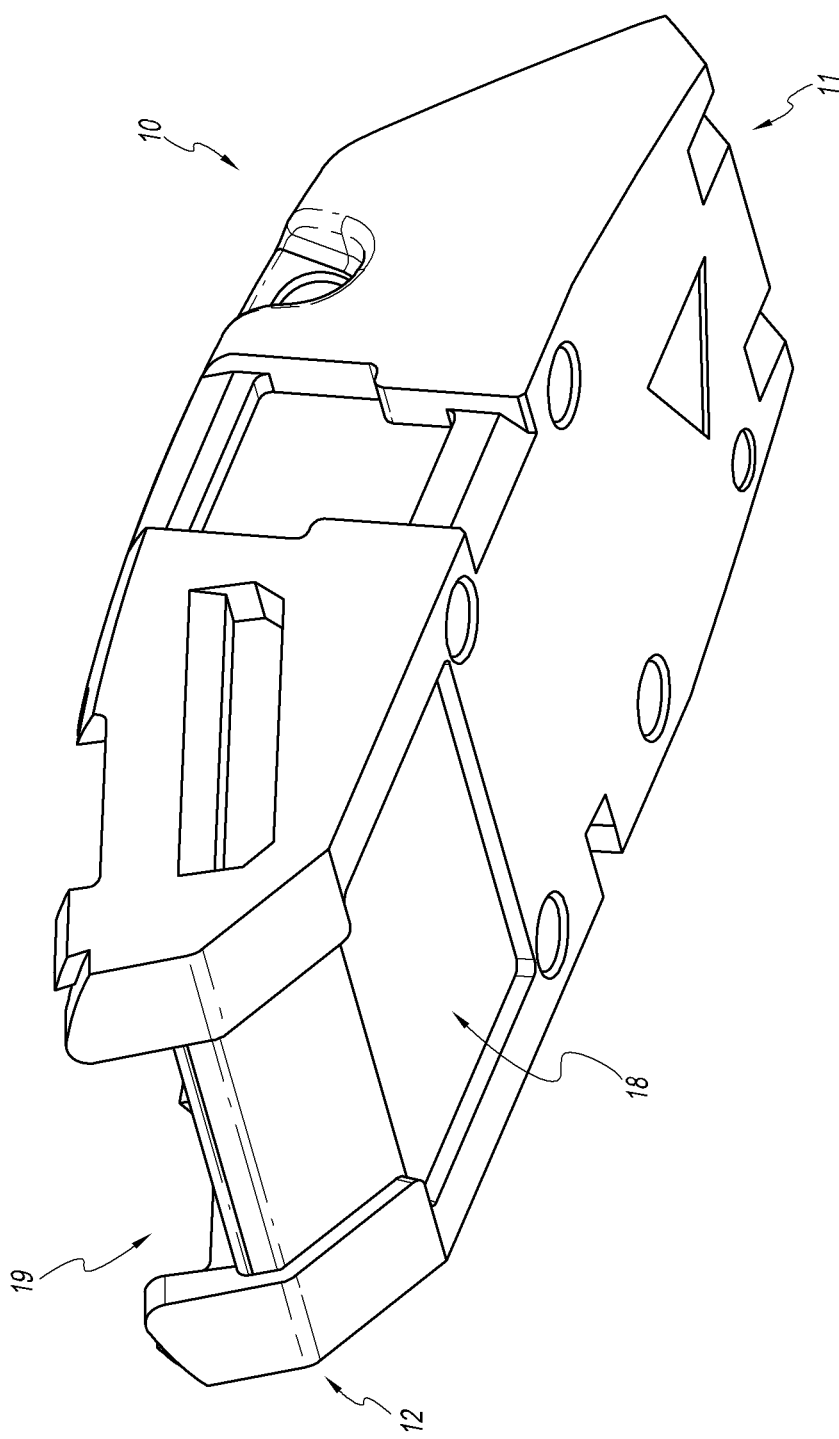
FIG. 5A is a three-dimensional, front, bottom, right side perspective view of the housing of FIG. 3A.
Figure 5B:
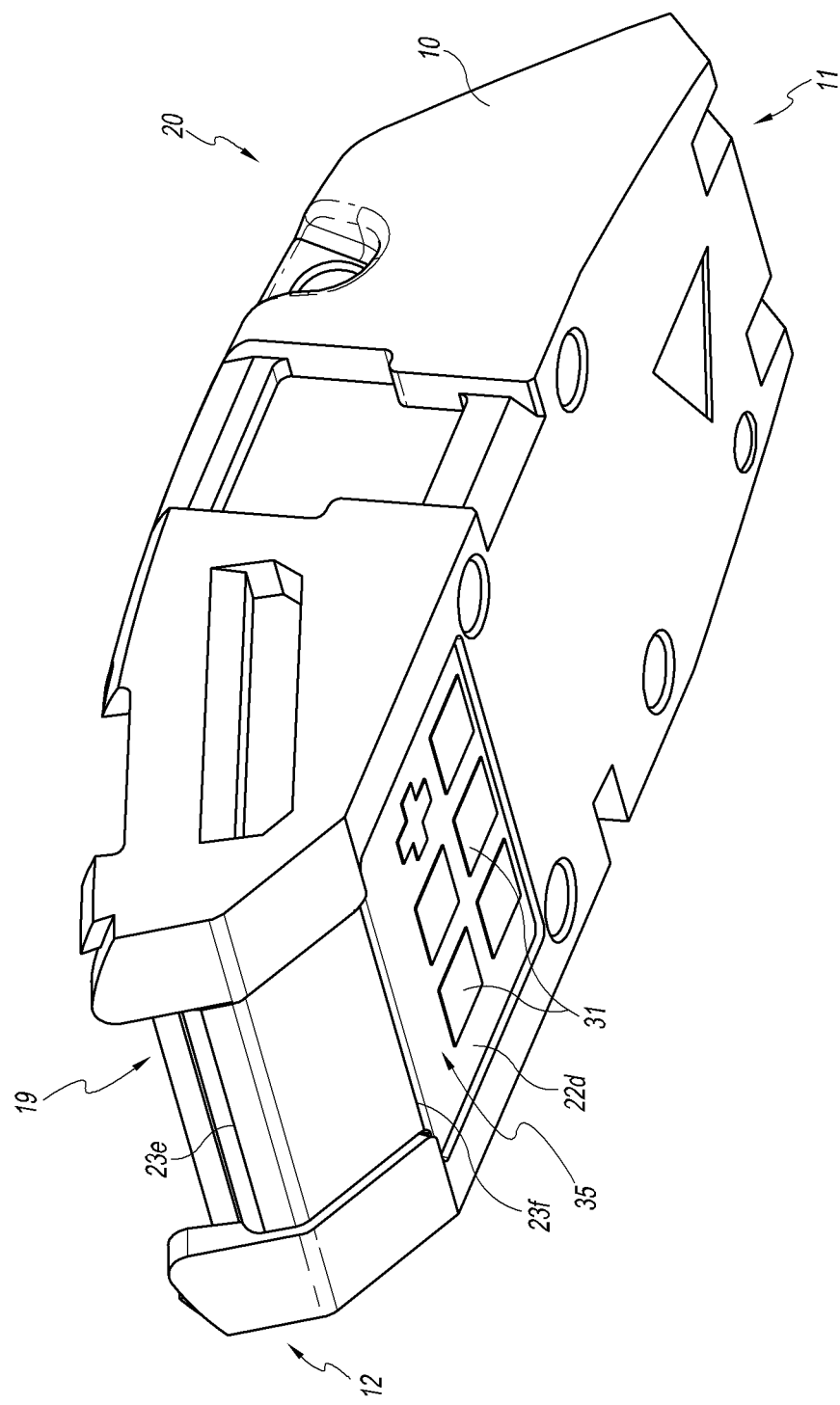
FIG. 5B is a three-dimensional, front, bottom, right side perspective view of the multi-port device package of FIG. 2.

FIG. 5A is a three-dimensional, front, bottom, right side perspective view of the housing 10 of FIGS. 3A and 4A. FIG. 5B is a view of the package 20 of FIG. 2 taken from the same perspective of FIG. 5A. Additional details of the housing 10 and the package 20 are shown in FIGS. 5A and 5B, respectively. For example, the right side of the housing 10 can include additional recesses and apertures that are configured to engage other system components and/or to mount to the system board or frame. The additional recesses and apertures on the outside of the housing 10 can enable for the mechanical and/or electrical integration of the package within the larger electronic system. For example, recesses near the rear end 11 may be used for snapping a rubber gasket into place to mechanically couple and/or seal the package 20 to the larger system. Also, as shown in FIG. 5B, an aperture 19 in the housing 10 can be formed that allows the substrate 21 to wrap about the housing. For example, as shown in FIG. 5B, the aperture 19 can be sized and shaped to receive bend 23e and neighboring segments of the substrate 21. While some of the features, such as a recess in the housing side visible in FIGS. 5A and 5B, do not interact with the illustrated substrate 21, the housing provides flexibility for other package designs with additional features and substrate segments.

Figure 6A:
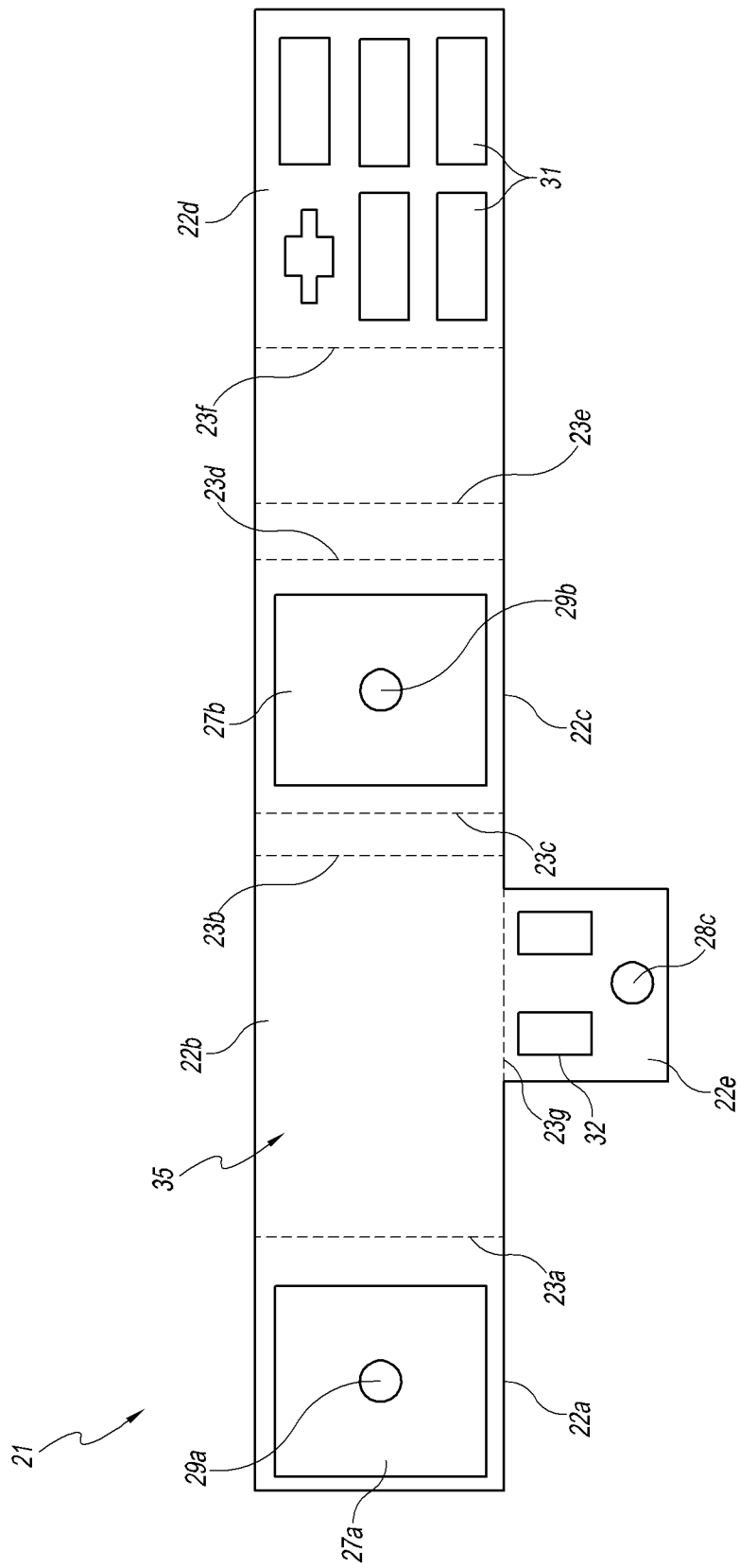
FIG. 6A is a plan view of an exterior surface of a substrate used in the package of FIG. 2.

FIG. 6A is a plan view of the exterior surface 35 of the substrate 21 used in the package 20 of FIGS. 2, 3B, 4B, and 5B. As illustrated in FIG. 6A, the substrate is in an unfolded condition before coupling to the housing 10. For example, as shown in FIG. 6A, the first stiffener 27a can be mounted to the exterior surface 35 of the first segment 22a, and the second stiffener 27b can be mounted to the exterior surface 35 of the third segment 22c. The leads 31 can be formed on the exterior surface 35 of the fourth segment 22d, and the interface features 32 can be provided on the exterior surface 35 of the fifth segment 22e.

Figure 6B:
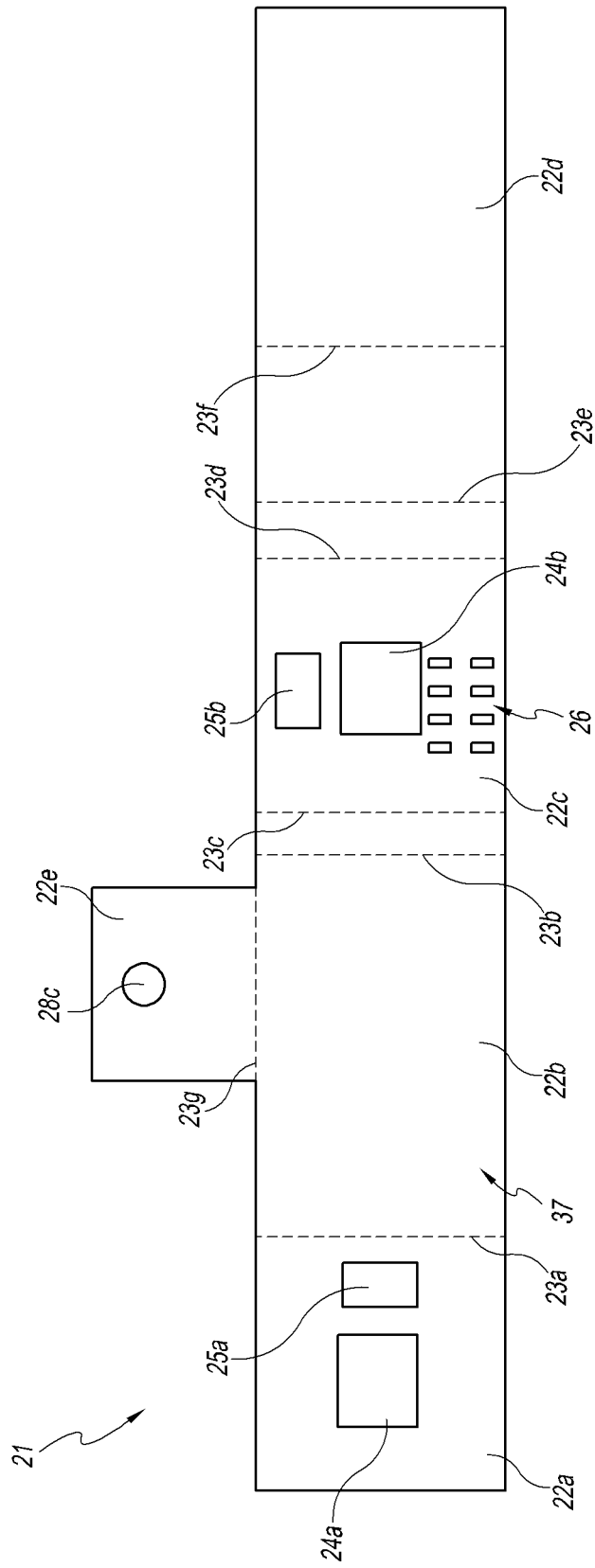
FIG. 6B is a plan view of an interior surface of the substrate of FIG. 6A.

FIG. 6B is a plan view of the interior surface 37 of the substrate 21 of FIG. 6A, with the substrate 21 in an unfolded condition. As shown in FIG. 6B, the first device die 24a and the first processor die 25a can be mounted to the interior surface 37 of the first segment 22a opposite the first stiffener 27a (FIG. 6A). The second device die 27b, the second processor die 25b, and the passive components 26 can be mounted to the interior surface 37 of the third segment 22c opposite the second stiffener 27b (FIG. 6A). Once the components shown in FIGS. 6A and 6B are mounted to or formed in the substrate 21, the substrate 21 can be coupled to the housing 10 and wrapped around the housing 10 to dispose the device dies 24a, 24b through the openings 38, 39 (see FIGS. 2 and 3A) of the housing. For example, the system assembler can fold the substrate 21 about the dashed lines in FIGS. 6A and 6B that represent the bends 23a-23g. When the substrate 21 is wrapped about the housing 10 to suitably position the dies 24a, 24b, the substrate can be adhered or bonded to the housing 10 to acoustically seal the substrate 21 to the housing 10.

Figure 7A:
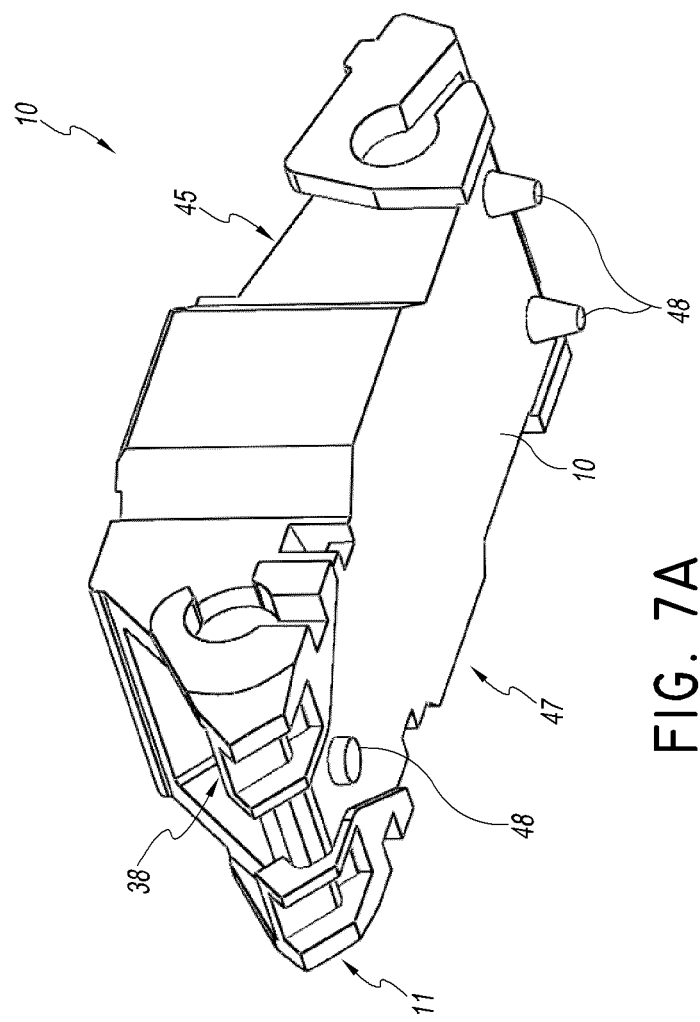
FIG. 7A is a three-dimensional, rear, bottom perspective view of a housing, according to one embodiment.

FIG. 7A is a three-dimensional, rear, bottom perspective view of a housing 10, according to one embodiment. FIG. 7C is a three-dimensional, top perspective view of the housing of FIG. 7A. Unless otherwise noted, reference numerals used in FIGS. 7A and 7C refer to the same or similar components as the reference numerals used in FIGS. 2-6B. For example, the housing 10 can include a top side 45, a bottom side 47, a rear end 11, and a front end 12. Further, the housing 10 can include a first opening 38, a second opening 39, a first cavity 13, and a second cavity 14. In addition, the housing 10 can include one or more pins 48 (e.g., three pins 48 are shown in FIG. 7A) on the bottom side 47 that are adapted to help align the housing 10 with the substrate 21 and/or with a system board that is integrated with the larger electronic device or system. For example, the pins 48 can be sized, shaped, and spaced relative to one another to align with the substrate 21. The substrate 21 can be fitted over the pins 48 to accurately align the substrate 21 with the housing 10. The pins 48 can also prevent tilt and rotation of the package when the package is assembled to the system board. For example, when the packaged device is coupled to the system motherboard, the pins 48 can similarly align with corresponding recesses in the system board in some embodiments.

Figure 7B:
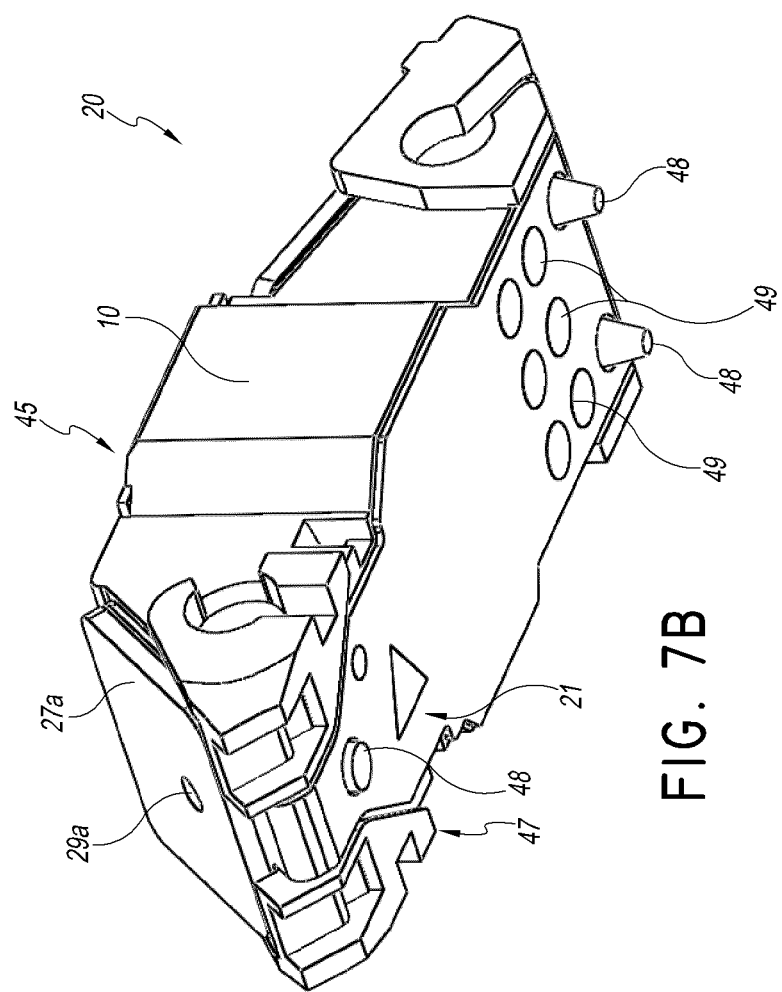
FIG. 7B is a three-dimensional, rear, bottom perspective view of a multi-port device package that includes the housing of FIG. 7A.
Figure 7C:
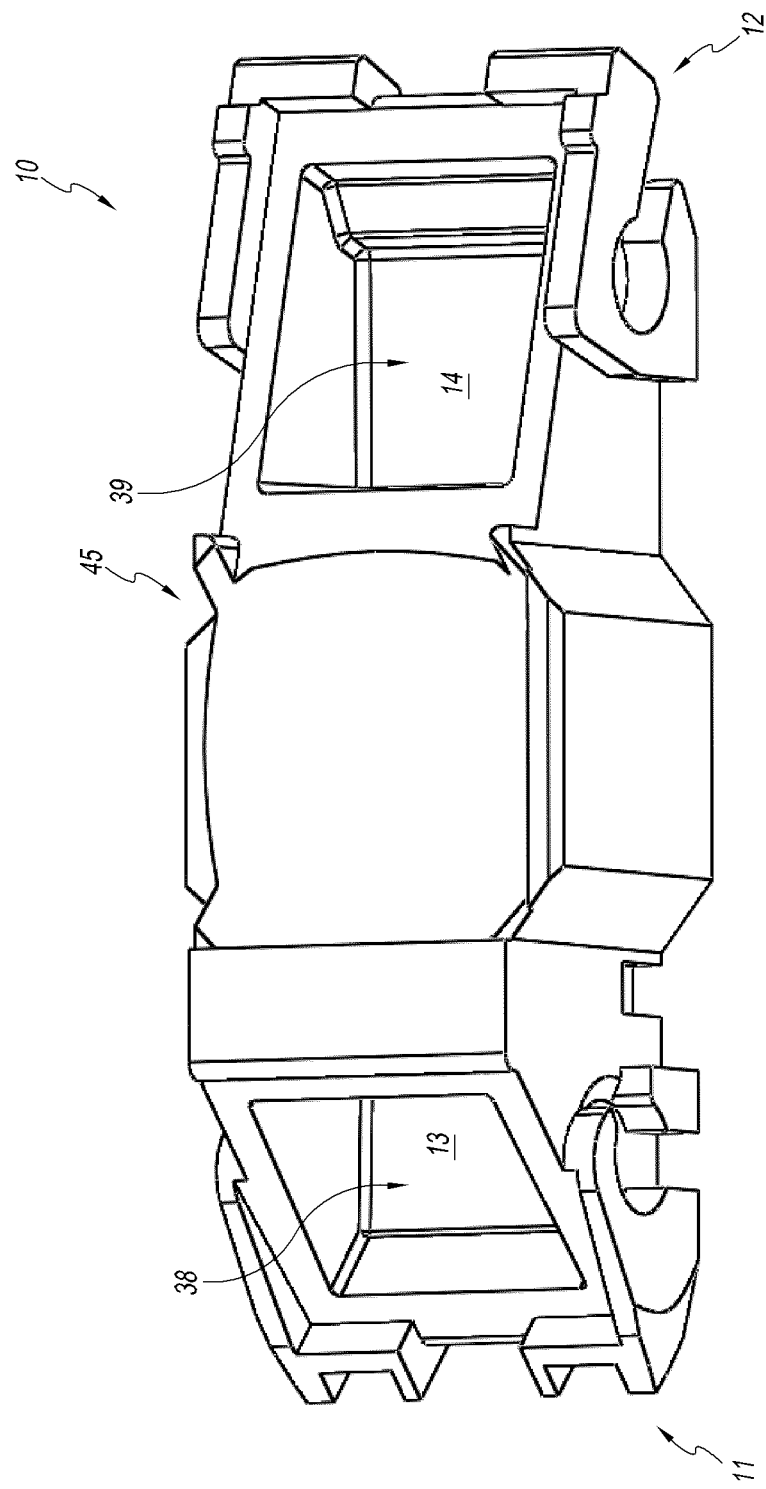
FIG. 7C is a three-dimensional, top perspective view of the housing of FIG. 7A.
Figure 7D:
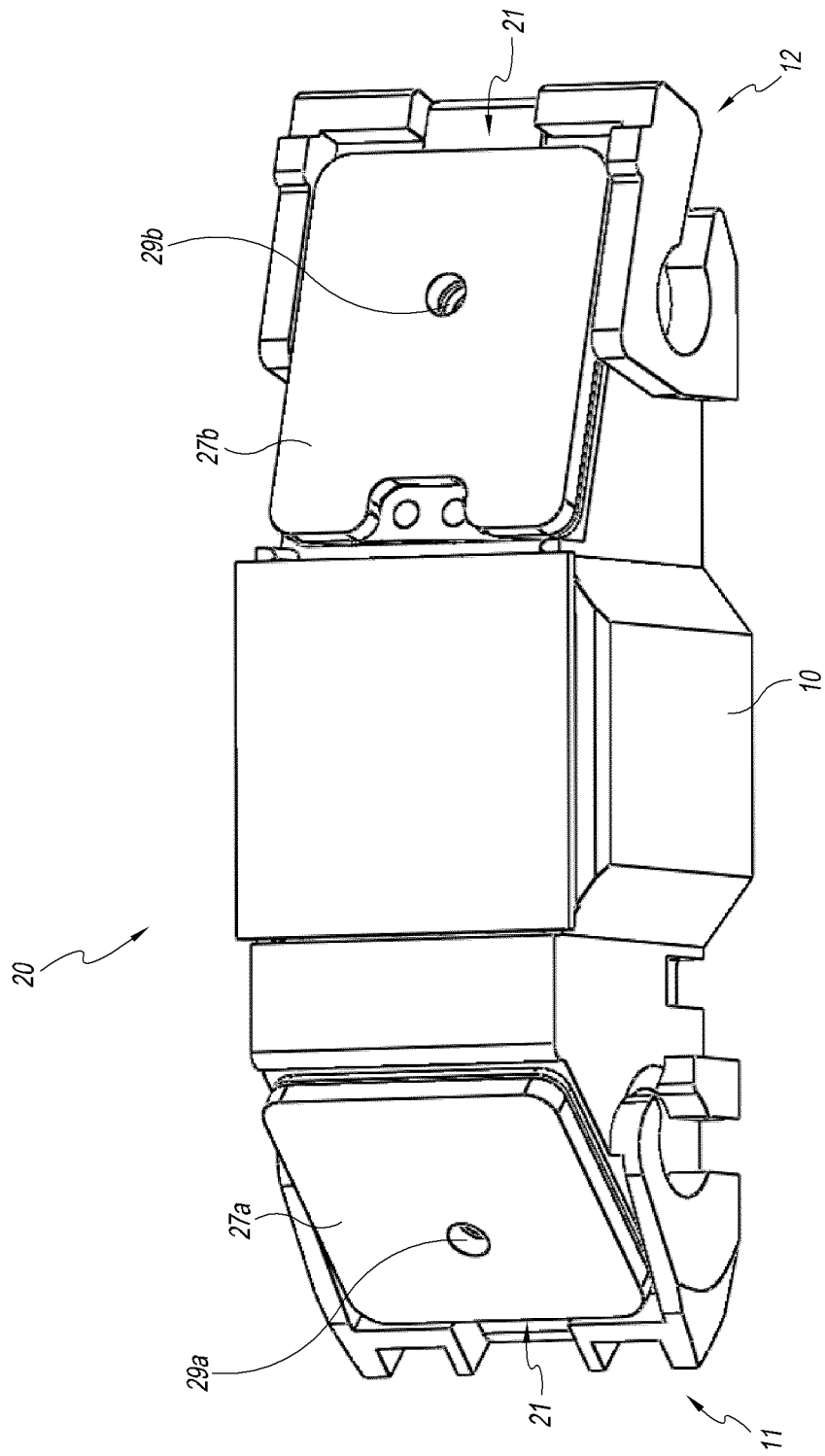
FIG. 7D is a three-dimensional, top perspective view of the multi-port device package of FIG. 7B.

FIG. 7B is a three-dimensional, rear, bottom perspective view of a multi-port device package 20 that includes the housing 10 of FIG. 7A. FIG. 7D is a three-dimensional, top perspective view of the multi-port device package 20 of FIG. 7B. Unless otherwise noted, the reference numerals of FIGS. 7B and 7D refer to components that are the same as or similar to the components referred to by the reference numerals in FIGS. 2-6B. For example, the package 20 can include a substrate 21 (e.g., a flexible substrate) wrapped around the housing 10. However, unlike the embodiments of FIGS. 2-6B, the substrate 21 is wrapped around the housing 10 such that the central portion of the substrate 21 is wrapped around the bottom side 47 of the housing 10. For example, the substrate 21 is wrapped about the bottom side 47 of the housing, and the segments of the substrate 21 that are coupled to the stiffeners 27a, 27b and device dies 24a, 24b are wrapped around the front and rear ends 11, 12 of the housing 10 to cover the openings 38, 39 of the housing 10. Furthermore, one or more leads 49 or contact pads can be provided on the exterior surface of the substrate 21 and coupled to the bottom side 47 of the housing 10. By wrapping the substrate 21 about the bottom side 47 of the housing 10, the robustness of the package input/output (I/O) can be improved.

FIG. 8A is a plan view of an exterior surface of the substrate used in the package 20 of FIGS. 7A-7D. FIG. 8B is a plan view of an interior surface of the substrate 21 of FIG. 8A. Unless otherwise noted, the reference numerals of FIGS. 8A-8B refer to components that are the same as or similar to the components referred to by the reference numerals in FIGS. 2-6B. For example, as with the embodiments described above, device dies 24a, 24b (which can be microphone device dies) and processor dies 25a, 25b can be mounted to the interior surface of the substrate and can be disposed in the cavities 13, 14 of the housing 10 when the substrate 21 is assembled to the housing 10. In addition, in some embodiments, an integrated passive device (IPD) can be stacked onto or otherwise coupled to the processor dies 25a, 25d. Further, stiffeners 27a, 27b that have associated port holes 29a, 29b can be coupled to the exterior surface of the substrate 21 and can be exposed on the outer surface of the assembled package 20.

Alignment holes 48' can be provided through the thickness of the substrate 21 and can be sized and shaped to align with the corresponding pins 48 of the housing 10. Thus, the substrate 21 can be coupled to the housing 10, and the pins 48 of the housing 10 can be inserted through the alignment holes 48' to align the substrate 21 to the housing 10 during assembly of the package 20. The alignment holes 48' and the pins 48 can thereby cooperate to align and secure the housing 10 with the substrate 21 during assembly, and the pins 48 can further act to align and secure the assembled package 20 to the system motherboard of the larger electronic device or system. Leads 49 or contact pads can be provided on the exterior surface of the substrate 21 to provide electrical communication between the system board (not shown) and the components mounted on the substrate 21 of the package 20.

Figure 9:
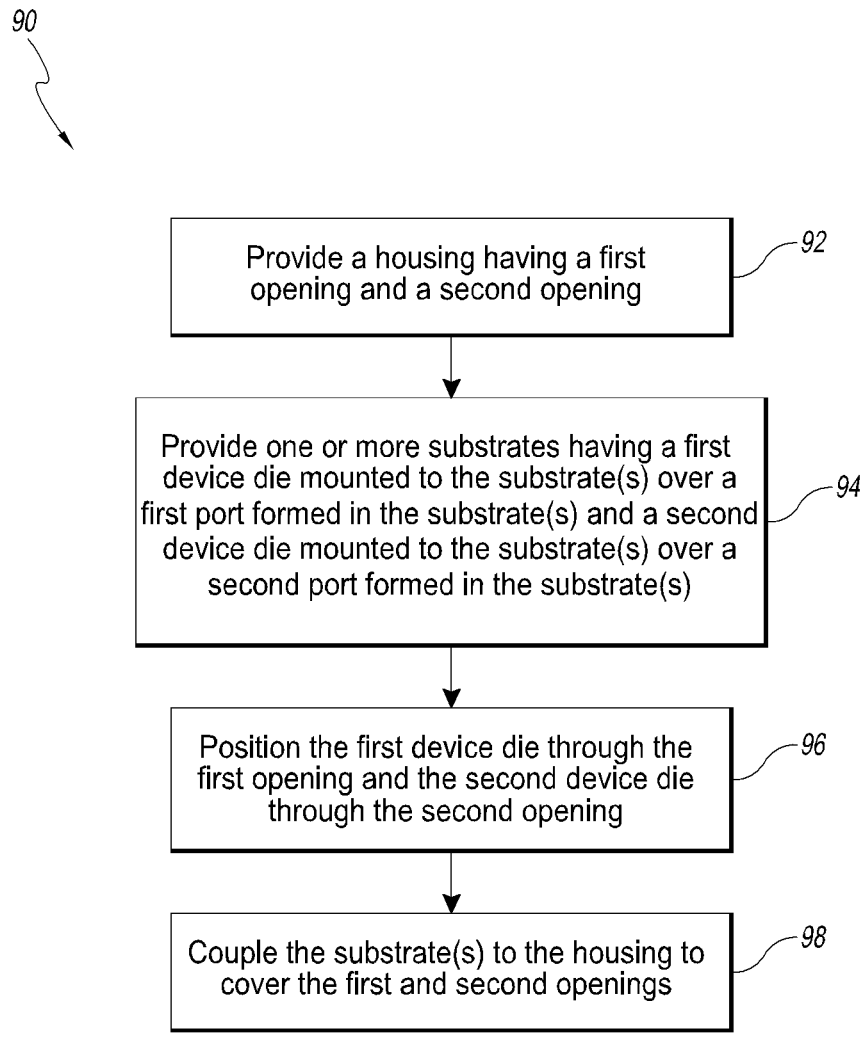
FIG. 9 is a flowchart illustrating a method of manufacturing an integrated device package, according to one embodiment.

FIG. 9 is a flowchart illustrating a method 90 of manufacturing an integrated device package, according to one embodiment. It should be appreciated that, although the method 90 is illustrated in a particular order, the steps may instead be performed in any suitable order and are not limited to the order illustrated in FIG. 9. The method 90 begins in a block 92 to provide a housing having a first opening and a second opening. The first and second openings can be in fluid communication with an interior volume of the housing. For example, the openings can be in fluid communication with multiple cavities that are shaped to act as backvolume for multiple microphone devices. The cavities can be isolated from other another within the housing. The first and second openings can be angled relative to one another at any suitable angle selected by the system assembler. As explained above, the housing can be three-dimensionally shaped to form any desired profile. For example, the size and shape of the cavities can be selected to achieve a desired backvolume for a microphone device. As explained above, the housing can comprise any suitable plastic, such as, e.g., LCP or ABS. In other embodiments, the housing can comprise a metal, such as zinc. In various embodiments, the housing can be formed by molding, three-dimensional printing, cast, etc.

The method 90 proceeds to a block 94 to provide one or more substrates having a first device die mounted to the substrate(s) over a first port formed in the substrate(s) and a second device die mounted to the substrate(s) over a second port formed in the substrate(s). In some embodiments, a single common substrate can be used; in other embodiments, multiple substrates can be used. As explained above, the substrate(s) can be a flexible substrate having integrated bond pads, leads and traces. The term flexible is used in contrast to conventional packaging substrates, such as PCB material, that cannot be bent around corners without damage to the substrate. Flexible substrates can be useful in arrangements where it is desirable for the substrate to conform to a particular geometry employed within a system, such as the three-dimensionally shaped housing. In some embodiments, the first and second device dies can be microphone device dies similar to the die 3 shown in FIG. 1. In addition, other types of device dies may be mounted to the substrate(s), such as processor device dies, sensor device dies (e.g., pressure sensors), optical device dies, inertial sensors (such as gyroscopes or accelerometers), and/or any suitable type of MEMS device die. For example, a processor die can be mounted adjacent each of the first and second device dies. The processor dies can pre-condition signals detected by the first and second device dies, such as by conversion of analog signals to digital signals. In addition, a stiffener can be mounted to the substrate(s) opposite each of the first and second device dies. The stiffener can provide structural support to the substrate(s) and/or device dies. In some embodiments, the stiffener can act as an RF shield, as explained above.

Moving to a block 96, the first device die is positioned through the first opening of the housing, and the second device die is positioned through the second opening of the housing. As explained above, the first and second openings can be angled relative to one another on different sides of the housing. In some embodiments, the substrate(s) can be folded about the housing such that a first segment is disposed over the first opening on a first side of the housing and a second segment is disposed over the second opening on a second side of the housing. Folding the substrate(s) about the housing allows the assembler to position the dies relative to one another at an angle according to the design of the housing. The assembler can insert the first and second device dies through the openings and into the corresponding cavities of the interior volume of the housing.

The method 90 can move to a block 98 in which the substrate(s) is coupled to the housing to cover the first and second openings. For example, as explained above, the substrate(s) can be adhered or bonded to the housing to substantially acoustically seal the edges of the substrate(s) to the housing. In some embodiments, a polymer gasket (e.g., neoprene) can be applied between the substrate(s) and the housing. Furthermore, in some embodiments, the stiffener can be reflow mounted to the housing to seal the cavities. Thus, the disclosed package and method can enable the substrate(s) to act as an acoustic seal for the package.

Advantageously, the method 90 shown in FIG. 9 can be more efficient than other packaging methods that utilize an initial microphone packaging process (e.g., in which a package lid is mounted to a substrate to enclose the microphone die) and a subsequent assembly process. As explained above with respect to FIG. 1, in other microphone packages, it can be more costly and time consuming to package the microphone device die in an initial process and then assemble the packaged microphone device into the larger system in a subsequent process. By contrast, the methods and packages disclosed herein may be performed in a single packaging and assembly process by which the housing is provided, components (e.g., device dies, shields, interfaces features, etc.) are provided on the substrate(s), and the substrate(s) is/are conformed to the housing to position the components through openings in the housing to at least partially be positioned within an interior volume of the housing.

Moreover, as explained above with respect to FIG. 1, other microphone packages can include a large number of components that may occupy a large volume relative to the overall size of the package. The method 90 of FIG. 9 and the embodiments illustrated herein can advantageously reduce or maintain the size of the package, while increasing the amount of volume available for use as backvolume for the microphone device dies. For example, in the disclosed embodiments, fewer components may be used than in other packages. Instead of using a standard PCB substrate for each microphone device die, for example, the illustrated embodiments include one or more flexible substrates that are significantly thinner than standard PCB substrates. Further, rather than using a separate lid for each microphone package, the disclosed embodiments may include a single housing that has multiple cavities formed therein that can be shaped to arbitrary and/or irregular geometries. Thus, the use of thin flexible substrates and a common housing that includes irregularly shaped cavities can reduce or maintain the overall size of the package, while increasing the relative volume of the package that can be used as backvolume to improve acoustic performance.

Applications

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, medical devices (such as a hearing aid), a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
a housing having a first opening and a second opening formed therein, the first and second openings in fluid communication with an interior volume of the housing;
one or more substrates including a first port and a second port;
a first device die mounted to the substrate(s) over the first port;
a second device die mounted to the substrate(s) over the second port,
wherein the substrate(s) is coupled to the housing to cover the first and second openings such that the first device die is disposed within the interior volume through the first opening and the second device die is disposed within the interior volume through the second opening; and
a first fluid pathway and a second fluid pathway,
wherein at least a portion of the first fluid pathway is along a line normal to the first port, with the normal line passing from an outside environs, through the first port, the first opening, and the first device die, and into the interior volume of the housing, and
wherein at least a portion of the second fluid pathway is along a line normal to the second port, with the normal line passing from an outside environs, through the second port, the second opening, and the second device die, and into the interior volume of the housing.

2. The integrated device package of claim 1, wherein the interior volume of the housing comprises a first cavity in communication with the first opening and a second cavity in communication with the second opening, and wherein the first and second cavities are acoustically separated from one another.

3. The integrated device package of claim 1, wherein the first and second device dies are microelectromechanical systems (MEMS) microphone dies.

4. The integrated device package of claim 1, wherein the substrate(s) is substantially acoustically sealed to the housing.

5. An integrated device package comprising:
a housing having a first opening and a second opening formed therein, the first and second openings in fluid communication with an interior volume of the housing,
one or more substrates including a first port and a second port;
a first device die mounted to the substrate(s) over the first port; and
a second device die mounted to the substrate(s) over the second port,
wherein the substrate(s) is coupled to the housing to cover the first and second openings such that the first device die is disposed within the interior volume through the first opening and the second device die is disposed within the interior volume through the second opening, and
wherein the first and second ports are angled relative to one another, wherein the first opening is formed on a first side of the housing, wherein the second opening is formed on a second side of the housing, and wherein the substrate(s) is folded such that a first segment of the substrate(s) is disposed over the first side of the housing and the first opening and a second segment of the substrate(s) is disposed over the second side of the housing and the second opening.

6. The integrated device package of claim 5, wherein the first and second device dies are mounted on surfaces of the first and second segments of the substrate(s) that face the housing, the integrated device package further comprising:
a first stiffener mounted on the first segment of the substrate(s) opposite the first device die, and
a second stiffener mounted on the second segment of the substrate(s) opposite the second device die.

7. The integrated device package of claim 5, wherein the substrate(s) is further folded such that a third segment of the substrate(s) is disposed over a third side of the housing, the second segment between the first and third segments, the package further comprising one or more leads on the third segment of the substrate(s), the one or more leads disposed on a surface of the substrate(s) opposite the first and second device dies.

8. The integrated device package of claim 1, further comprising a first processor die mounted to the substrate adjacent to and in electrical communication with the first device die and a second processor die mounted to the substrate adjacent to and in electrical communication with the second device die.

9. A method of manufacturing an integrated device package, the method comprising:
provoding a housing having a first opening and a second opening formed on different sides of the housing, the first and second openings in fluid communication with an interior volume of the housing;
providing one or more substrate(s) having a first device die mounted to the substrate(s) over a first port formed in the substrate(s) and a second device die mounted to the substrate(s) over a second port formed in the substrate(s);
positioning the first device die through the first opening and the second device die through the second opening; and
coupling the substrate(s) to the housing to cover the first and second openings.

10. The method of claim 9, further comprising:
folding the substrate(s) about the housing to position the first device die through the first opening and to position the second device die through the second opening; and
angling the first and second device dies relative to one another.

11. The method of claim 10, wherein the first opening is formed on a first side of the housing, and wherein the second opening is formed on a second side of the housing, wherein folding the substrate(s) comprises folding the substrate(s) at least about the first and second sides of the housing such that a first segment of the substrate(s) is disposed over the first opening and a second segment of the substrate(s) is disposed over the second opening.

12. The method of claim 9, wherein coupling the substrate (s) to the housing comprises acoustically sealing the substrate (s) to the housing.

13. The method of claim 9, wherein the first and second device dies comprise microphone device dies.

14. The method of claim 13, further comprising:
mounting a first processor die adjacent the first device die and electrically coupling the first processor die to the first device die; and
mounting a second processor die adjacent the second device die and electrically coupling the second processor die to the second device die.

15. An integrated device package comprising:
a housing having a first opening formed on a first side of the housing and a second opening formed on a second side of the housing, wherein the first and second openings are in fluid communication with an interior volume of the housing;
a substrate folded about at least two sides of the housing to cover the first and second openings;
a first device die mounted to the substrate and disposed through the first opening; and
a second device die mounted to the substrate and disposed through the second opening.

16. The integrated device package of claim 15, wherein the substrate includes a first port and a second port, and wherein the first device die is mounted over the first port and the second device die is mounted over the second port.

17. The integrated device package of claim 15, wherein the first and second device dies are microphone dies.

18. The integrated device package of claim 15, wherein the housing includes a first cavity in fluid communication with the first opening and a second cavity in fluid communication with the second opening, and wherein the first and second cavities are acoustically separated from one another.

19. The integrated device package of claim 15, wherein the substrate is substantially acoustically sealed to the housing.

20. The integrated device package of claim 15, wherein the first and second device dies are angled relative to one another.

* * * * *